(12) United States Patent
Lu et al.

(10) Patent No.: US 8,835,304 B2
(45) Date of Patent: Sep. 16, 2014

(54) METHOD OF SEMICONDUCTOR INTEGRATED CIRCUIT FABRICATION

(75) Inventors: Chih Wei Lu, Hsinchu (TW); Chung-Ju Lee, Hsinchu (TW); Hsiang-Huan Lee, Jhudong Township, Hsinchu County (TW); Tien-I Bao, Dayuan Township, Taoyuan County (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 91 days.

(21) Appl. No.: 13/599,764

(22) Filed: Aug. 30, 2012

(65) Prior Publication Data

US 2014/0065818 A1  Mar. 6, 2014

(51) Int. Cl.
*H01L 21/00* (2006.01)
(52) U.S. Cl.
USPC .......................................... 438/619; 438/637

(58) Field of Classification Search
CPC ..................... H01L 21/7682; H01L 21/76885
USPC ................................................... 438/637–640
See application file for complete search history.

(56) References Cited

U.S. PATENT DOCUMENTS

2006/0113675 A1*  6/2006  Chang et al. .................. 257/763
2008/0124917 A1*  5/2008  Oh et al. ....................... 438/637

* cited by examiner

*Primary Examiner* — Richard Booth
(74) *Attorney, Agent, or Firm* — Haynes and Boone, LLP

(57) ABSTRACT

A method of fabricating a semiconductor integrated circuit (IC) is disclosed. The method includes providing a substrate. A sacrifice layer (SL) is formed and patterned on the substrate. The patterned SL has a plurality of openings. The method also includes forming a metal layer in the openings and then removing the patterned SL to laterally expose at least a portion of the metal layer to form a metal feature, which has a substantial same profile as the opening. A dielectric layer is deposited on sides of the metal feature.

20 Claims, 8 Drawing Sheets

METHOD OF SEMICONDUCTOR INTEGRATED CIRCUIT FABRICATION

BACKGROUND

The semiconductor integrated circuit (IC) industry has experienced exponential growth. Technological advances in IC design and material have produced generations of ICs where each generation has smaller and more complex circuits than previous generation. In the course of IC evolution, functional density (i.e., the number of interconnected devices per chip area) has generally increased while geometry size (i.e., the smallest component (or line) that can be created using a fabrication process) has decreased.

This scaling down process generally provides benefits by increasing production efficiency and lowering associated costs. Such scaling down has also increased the complexity of IC processing and manufacturing. For these advances to be realized, similar developments in IC processing and manufacturing are needed. When a semiconductor device such as a metal-oxide-semiconductor field-effect transistor (MOSFET) is scaled down through various technology nodes, interconnects conductive lines and associated dielectric materials that facilitate wiring between the transistors and other devices play more and more important role on IC performance improvement. Studies and researches are heavily conducted to search not only new conductive and dielectric materials, such as copper metallurgy and low dielectric constant (k) material, but also new process integration schemes for a better interconnection. Although existing methods of fabricating IC devices have been generally adequate for their intended purposes, they have not been entirely satisfactory in all respects. For example, to minimize process-induced-damage on the low-k dielectric material layer raises challenges in IC process developments. It is desired to have improvements in this area.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

It is to be understood that the following disclosure provides many different embodiments, or examples, for implementing different features of the disclosure. Specific examples of components and arrangements are described below to simplify the present disclosure. These are, of course, merely examples and are not intended to be limiting. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description that follows may include embodiments in which the first and second features are formed in direct contact, and may also include embodiments in which additional features may be formed between the first and second features, such that the first and second features may not be in direct contact.

Figure 1:
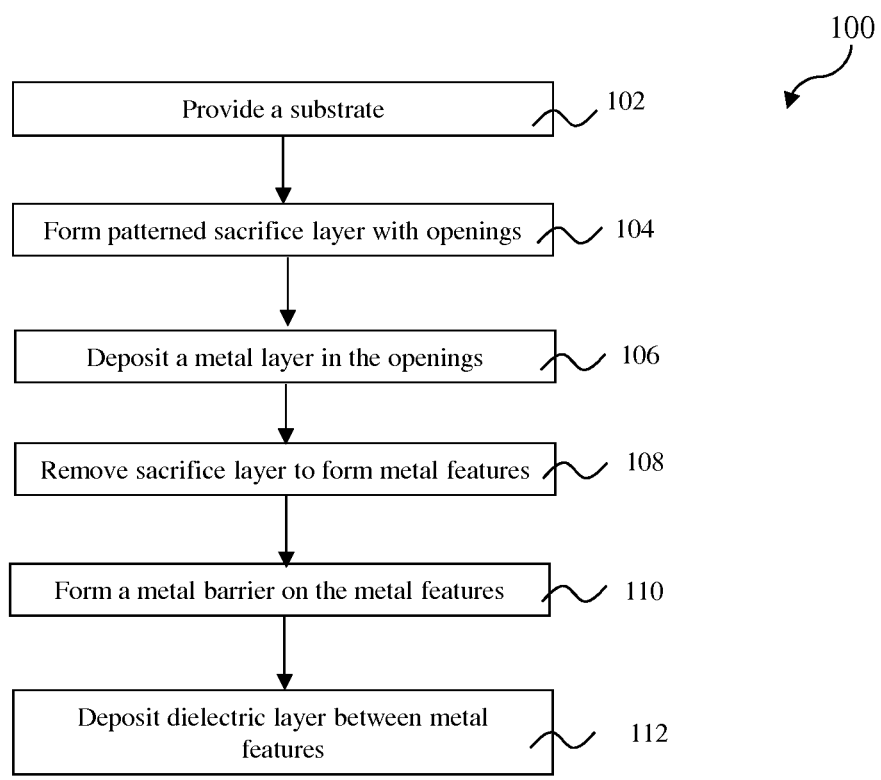
FIG. 1 is a flowchart of an example method for fabricating a semiconductor integrated circuit (IC) constructed according to various aspects of the present disclosure.

FIG. 1 is a flowchart of one embodiment of a method 100 of fabricating one or more semiconductor devices according to aspects of the present disclosure. The method 100 is discussed in detail below, with reference to a semiconductor device 200 shown in FIGS. 2 to 8 for the sake of example.

Figure 2:
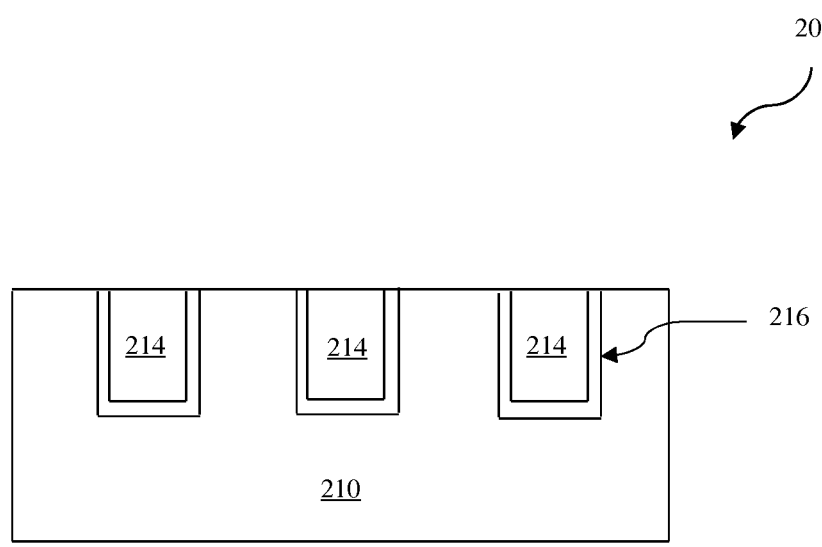
FIGS. 2 to 8 are cross-sectional views of an example semiconductor integrated circuit (IC) device at fabrication stages constructed according to the method of FIG. 1.

Referring to FIG. 2, the method 100 begins at step 102 by providing a semiconductor substrate 210. The semiconductor substrate 210 includes silicon. Alternatively or additionally, the substrate 210 may include other elementary semiconductor such as germanium. The substrate 210 may also include a compound semiconductor such as silicon carbide, gallium arsenic, indium arsenide, and indium phosphide. The substrate 210 may include an alloy semiconductor such as silicon germanium, silicon germanium carbide, gallium arsenic phosphide, and gallium indium phosphide. In one embodiment, the substrate 210 includes an epitaxial layer. For example, the substrate 210 may have an epitaxial layer overlying a bulk semiconductor. Furthermore, the substrate 210 may include a semiconductor-on-insulator (SOI) structure. For example, the substrate 210 may include a buried oxide (BOX) layer formed by a process such as separation by implanted oxygen (SIMOX) or other suitable technique, such as wafer bonding and grinding.

The substrate 210 may also include various p-type doped regions and/or n-type doped regions, implemented by a process such as ion implantation and/or diffusion. Those doped regions include n-well, p-well, light doped region (LDD), heavily doped source and drain (S/D), and various channel doping profiles configured to form various integrated circuit (IC) devices, such as a complimentary metal-oxide-semiconductor field-effect transistor (CMOSFET), imaging sensor, and/or light emitting diode (LED). The substrate 210 may further include other functional features such as a resistor or a capacitor formed in and on the substrate.

The substrate 210 may also include various isolation features. The isolation features separate various device regions in the substrate 210. The isolation features include different structures formed by using different processing technologies. For example, the isolation features may include shallow trench isolation (STI) features. The formation of a STI may include etching a trench in the substrate 210 and filling in the trench with insulator materials such as silicon oxide, silicon nitride, or silicon oxynitride. The filled trench may have a multi-layer structure such as a thermal oxide liner layer with silicon nitride filling the trench. A chemical mechanical polishing (CMP) may be performed to polish back excessive insulator materials and planarize the top surface of the isolation features.

The substrate 210 may also include gate stacks formed by dielectric layers and electrode layers. The dielectric layers may include an interfacial layer (IL) and a high-k (HK) dielectric layer deposited by suitable techniques, such as chemical vapor deposition (CVD), atomic layer deposition (ALD), physical vapor deposition (PVD), thermal oxidation, combinations thereof, or other suitable techniques. The electrode layers may include a single layer or multi layers, such as metal layer, liner layer, wetting layer, and adhesion layer, formed by ALD, PVD, CVD, or other suitable process.

The substrate 210 may also include a plurality of inter-level dielectric ((ILD) layers and conductive features integrated to form an interconnect structure configured to couple the various p-type and n-type doped regions and the other functional features (such as gate electrodes), resulting a functional integrated circuit. In one example, the substrate 210 may include a portion of the interconnect structure and the interconnect structure includes a multi-layer interconnect (MLI) structure and an ILD layer integrated with a MLI structure, providing an electrical routing to couple various devices in the substrate 210 to the input/output power and signals. The interconnect structure includes various metal lines, contacts and via features (or via plugs). The metal lines provide horizontal electrical routing. The contacts provide vertical connection between silicon substrate and metal lines while via features provide vertical connection between metal lines in different metal layers.

Referring again to FIG. 2, the substrate 210 includes conductive structures 214. The conductive features 214 include a portion of the interconnect structure. For example, the conductive features 214 include contacts, metal vias, or metal lines. In this case, the conductive features 214 may be further surrounded by a barrier layer 216 to prevent diffusion and/or provide material adhesion. The conductive feature 214 may include aluminum (Al), copper (Cu) or tungsten (W). The barrier layer 216 may include titanium nitride (TiN), tantalum nitride (TaN), tungsten nitride (WN), titanium silicon nitride (TiSiN) or tantalum silicon nitride (TaSiN). The conductive features 214 and the barrier layer 216 may be formed by a procedure including lithography, etching and deposition. In another embodiment, the conductive feature 214 includes an electrode, a capacitor, a resistor or a portion of a resistor. Alternatively, the conductive features 214 include a doped region (such as a source or a drain), or a gate electrode. In another example, the conductive features 214 are silicide features disposed on respective source, drain or gate electrode. The silicide feature may be formed by a self-aligned silicide (salicide) technique.

The method 100 proceeds to step 104 by forming a patterned sacrifice layer (SL) on the substrate. The SL may include any appropriate materials, such as spin-on-glass (SOG) and dielectric materials deposited by any suitable method, such as spin-on coating, ALD, CVD, and ozone oxidation. The SL may also include a polymer that turns soluble to a base solution in response to reaction with acid. In one embodiment, the SL is patterned by lithography to form the openings, which are aligned with respective conductive features.

Figure 3:
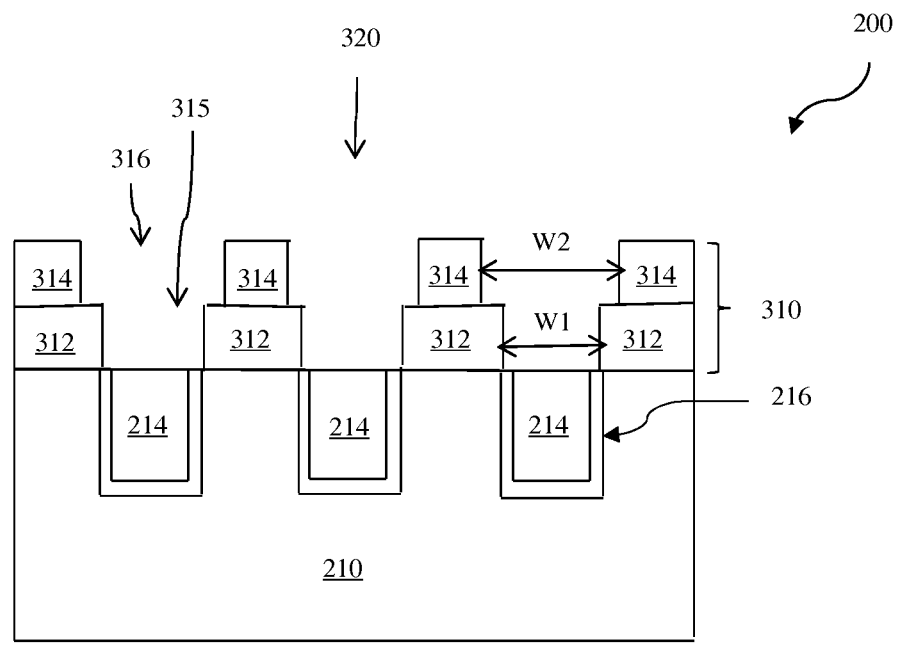

Referring to FIG. 3, in one embodiment, a SL 310 includes a first SL 312 formed on the substrate 210 and a second SL 314 formed on top of the first SL 312. In yet another embodiment, the first SL 312 and the second SL 314 are two different types of photosensitive materials. In general, a photosensitive material is configured such that when it is exposed to light, chemical reactions happen in exposed regions of the photosensitive material, which increase or decrease solubility of the exposed regions. If the exposed regions become more soluble, the photosensitive material is referred to as a positive photoresist. If the exposed regions become less soluble, the photosensitive material is referred to as a negative photoresist. In the present example, the first SL 312 is a negative photoresist material and the second SL 314 is a positive photoresist material. Alternatively, the first SL 312 is a positive photoresist material and the second SL 314 is a negative photosensitive material.

In the present embodiment, the first photosensitive SL 312 is patterned by exposing it through a photomask using an exposing tool and the openings 315 are formed. Then, the second photosensitive SL 314 is coated on the first openings 315 and patterned by the second lithography process. The openings 316 are formed. Openings 315 and 316 are collectively referred to as openings 320. It is understood that the openings 320 do not have to be multi-tiered, as shown with openings 315 and 316. The exposing tool may include an optical exposing tool, such as I-line (365 nm), deep ultraviolet (DUV), extreme ultraviolet (EUV), or X-ray exposing tool, or a charged particle tool such as an electron beam writer. The photomask blocks some portions of the light and passes some portions of the light. When the light projects on the first photosensitive SL 312, it reacts with a photo sensitive chemical in the first photosensitive SL 312 to form a latent image. Additionally, a dehydration process may be performed before applying the first photosensitive SL 312 on the substrate 210, which can enhance an adhesion of the first photosensitive SL 312 to the substrate 210. The dehydration process may include baking the substrate 210 at a high temperature for duration of time, or applying a chemical such as hexamethyldisilizane (HMDS) to the substrate 210. Alternatively, a soft bake (SB) may be applied, which may increase a mechanical strength of the first photosensitive SL 312.

Thereafter, a developing solution may be utilized to remove portions of the first photosensitive SL 312 to form the first openings 315 with a first width (W1). The first openings 315 are referred as vias 315. The developing solution may remove the exposed or unexposed portions depending on the type of photosensitive material of the first photosensitive SL 312. If the first photosensitive SL 312 includes a negative-type resist, the exposed portions are not dissolved by the developing solution while the non-exposed portions are dissolved. If the first photosensitive SL 312 includes a positive-type resist, the exposed portions are dissolved by a positive-tone developing solution while leaving the unexposed portions behind. Additionally a post expose bake (PEB), a post develop bake (PDB), or both may be applied.

The second photosensitive SL 314 is formed on top of the patterned first photosensitive SL 312 and has second openings 316, referred to as trenches 316, on the top of the vias 315. A center of the trench 316 is aligned to a respective center of the via 315. The trench 316 has a vertical sidewall profile with a second width W2. In one embodiment, W2 is larger than W1. A formation of the patterned second SL 314 is similar in many respects to the one of the patterned first SL 312.

Figure 4:
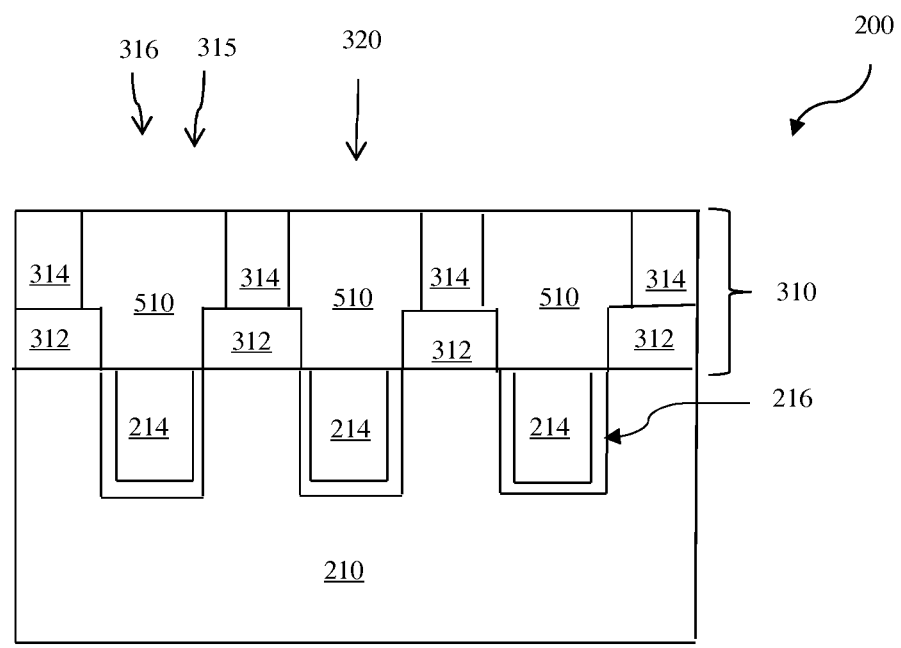

The method 100 proceeds to step 106 by filling in the openings 320 with a metal layer 510, as shown in FIG. 4. The metal layer 510 may include Cu, Al, W, or other suitable conductive material. In the present embodiment, the metal layer 510 includes copper or copper alloy, such as copper magnesium (CuMn), copper aluminum (CuAl), copper titanium, (CuTi), copper vanadium (CuV), copper chromium (CuCr), copper silicon (CuSi) or copper niobium (CuNb). In one embodiment, the metal layer 510 includes a copper seed layer deposited by PVD and bulk copper layer by electrochemical plating (ECP). In various other examples, the metal layer 510 may be deposited by techniques, such as PVD, CVD, metal-organic chemical vapor deposition (MOCVD), electroless plating, chemical plating and autocatalytic plating. Additionally, a chemical mechanical polishing (CMP) process is applied to remove excess metal layer 510 and exposes a top surface of the SL 310.

Figure 5:
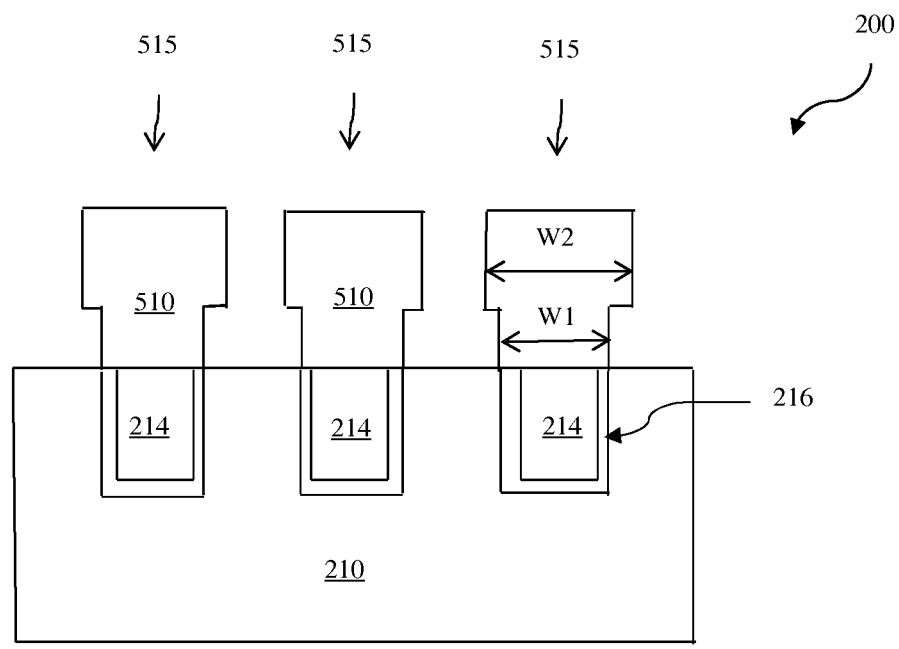

The method 100 proceeds to step 108 by removing the patterned SL 310 to laterally expose at least a portion of the metal layer 510 to form metal features 515, as shown in FIG. 5. The patterned SL 310 is removed by an etch technique such as dry etch, wet etch, or combinations thereof. For example, the photosensitive SLs 312 and 314 are removed by a wet stripping process. For another example, the photosensitive SLs 312 and 314 are removed by an $O_2$ plasma ashing. In another embodiment, the SL 310 is partially removed.

The metal features 515 have a substantial same profile as the openings 320. For example, when the openings 320 are formed by the vias 315 and trenches 316, the metal features 515 are configured to have vertical profiles such that they have a lower portion with the first width (W1) and an upper portion with the second width (W2).

In one embodiment, when the underlying conductive features 214 are metal lines of a different metal layer, the metal features 515 are also referred to as metal vias, via features or vias to provide vertical electrical routing between metal lines. In an alternative embodiment when the underlying conductive features 214 are source/drain features and/or gate electrodes, the metal features 515 are also referred to as metal contact, contact features or contacts to provide electrical routing between metal lines and semiconductor substrate.

Figure 6:
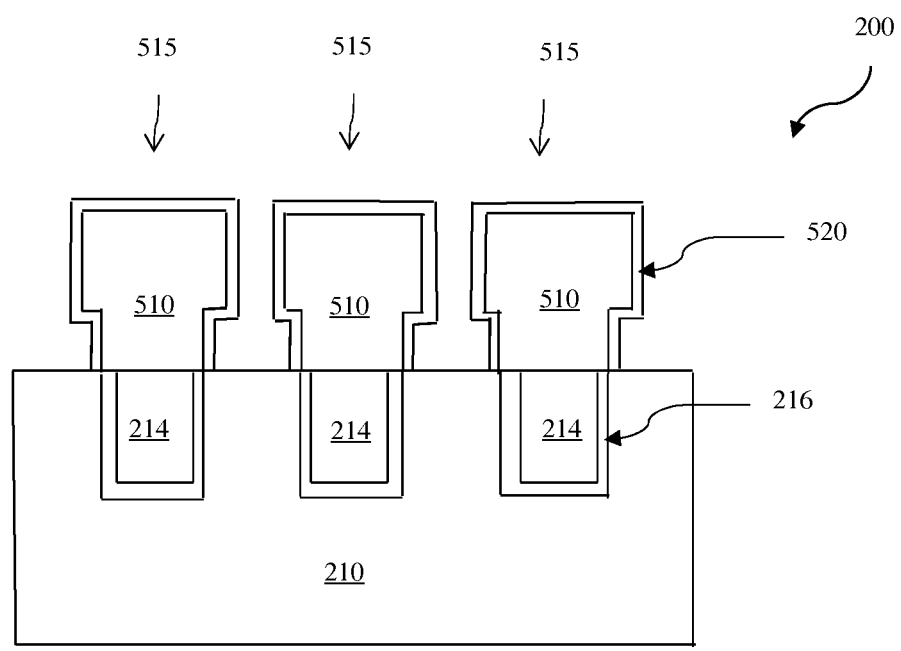

The method 100 proceeds to step 110 by forming a barrier 520 wrapping over the metal features 515, as shown in FIG. 6. The barrier layer 520 includes metals and is electrically conductive but does not permit inter-diffusion and reactions between the metal layer 510 and a dielectric layer to be filled between the metal features 515. In one embodiment, a metal anneal process is applied to the metal features 515 to form a self-forming barrier 520 wrapping over the metal features 515. The anneal process may be a rapid thermal anneal (RTA), a laser anneal, and/or a flash lamp anneal. The anneal process may be conducted in oxygen ambient, a combination of steam ambient and oxygen ambient, or under an inert gas atmosphere.

In another embodiment, the barrier layer 520 is formed by techniques such as PVD, CVD), MOCVD and ALD, or other suitable technique. The barrier layer 520 may include TiN, TaN, Co, WN, TiSiN, TaSiN, or combinations thereof. In yet another embodiment, the barrier layer 520 includes multiple films.

Figure 7:
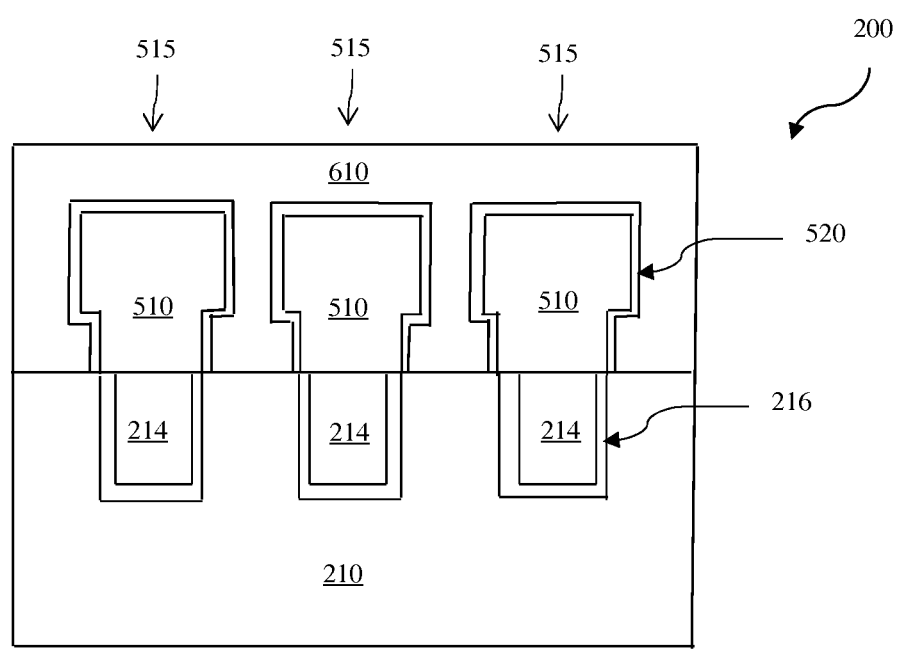
Figure 8:
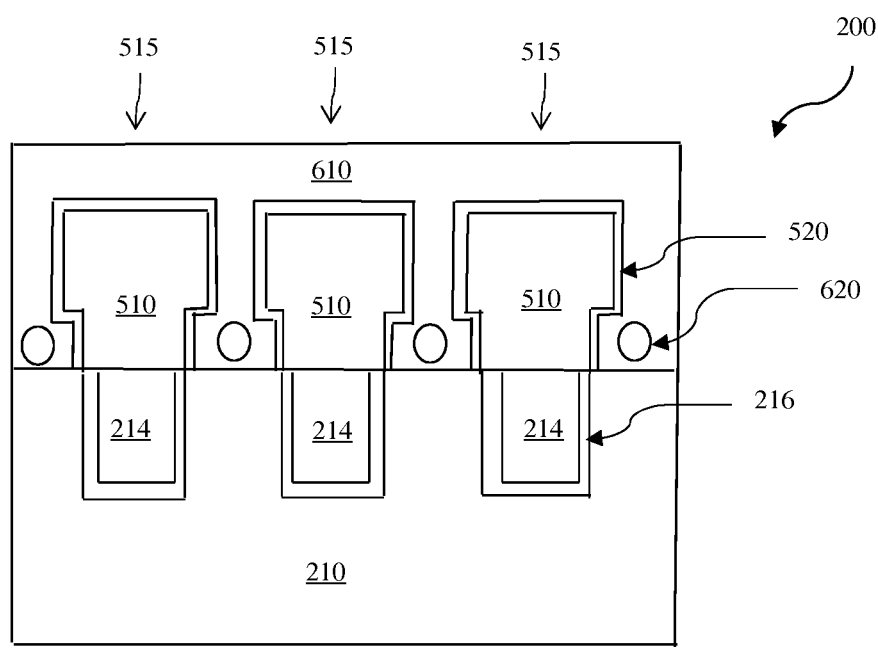

The method 100 proceeds to step 112 by depositing a dielectric material layer 610 to fill in regions between the metal features 515, as shown in FIG. 7. The dielectric material layer 610 includes dielectric materials, such as silicon oxide, silicon nitride, a dielectric material having a dielectric constant (k) lower than thermal silicon oxide (therefore referred to as low-k dielectric material layer), or other suitable dielectric material layer. In various examples, the low k dielectric material may include fluorinated silica glass (FSG), carbon doped silicon oxide, Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, and/or other materials as examples. In another example, the low k dielectric material may include an extreme low k dielectric material (XLK). In yet another example, the low k dielectric material layer includes a porous version of an existing Dow Corning dielectric material called FOX (flowable oxide) which is based on hydrogen silsesquioxane. A process of forming the dielectric material layer 610 may utilize spin-on coating or CVD. In another embodiment, the dielectric material layer 610 is deposited by a spin-on dielectric (SOD) process to substantially fill in the regions between the metal features 515.

In one embodiment, the dielectric material layer 610 substantially fills the regions between the metal features 515. Alternatively, referring to FIG. 8, the dielectric material layer 610 disposed between the metal features 515 includes voids 620 (or air gaps) to further reduce the average dielectric constant and increase the isolation efficiency. The air gaps 620 may be formed by choosing and tuning a proper deposition process to form the dielectric material layer 610. As an example, the dielectric material layer 610 is deposited by CVD and the CVD deposition rate is tuned to be high enough such that the dielectric material layer 610 closes up before completely filling in the regions between the metal feature 515, resulting in the air gaps 620.

Additional steps can be provided before, during, and after the method 100, and some of the steps described can be replaced, eliminated, or moved around for additional embodiments of the method 100.

Based on the above, the present disclosure offers methods for fabricating IC device. The method employs forming a patterned sacrifice layer for a metal layer deposition and then removing the patterned sacrifice layer to form metal features. After the metal features' formation, a dielectric layer, such as a low-k material, is deposited between metal features. The method provides an etch-free integration scheme for low-k/metal interconnection. The method reduces process-induced-damages on the low-k dielectric material layer in interconnection formation.

The present disclosure provides many different embodiments of fabricating a semiconductor IC that provide one or more improvements over the prior art. In one embodiment, a method for fabricating a semiconductor integrated circuit (IC) includes providing a substrate and forming a patterned sacrifice layer (SL) on the substrate. The patterned SL has a plurality of openings. The method also includes forming a metal layer in the openings and removing the patterned SL to laterally expose at least a portion of the metal layer to form a metal feature. The metal feature has a substantial same profile as the opening. The method also includes depositing a dielectric layer on sides of the metal feature.

In another embodiment, a method for fabricating a semiconductor IC includes providing a substrate, forming a first sacrifice layer (SL) on the substrate, patterning the first SL to have a plurality of first openings with a first width, forming a second SL on the patterned first SL and patterning the second SL to have a plurality of second openings with a second width. A center of the second opening aligns to a center of the first opening. The first and second openings form an opening with the first opening as its lower portion and the second opening as its upper portion. The method also includes depositing a metal layer in the opening, removing the first and the second SLs to laterally expose at least a portion of the metal layer to form a metal feature with a substantially same profile as the opening, forming a barrier layer wrapping over the metal feature and depositing a dielectric layer on sides of the metal feature.

In yet another embodiment, a method for fabricating a semiconductor IC includes providing a substrate, forming a first photosensitive sacrifice layer (SL) on the substrate, patterning the first photosensitive SL to have a plurality of first openings with a first width, forming a second photosensitive SL on the patterned photosensitive first SL and patterning the second photosensitive SL to have a plurality of second openings with a second width. The second width is substantially larger than the first width. A center of the second opening aligns to a center of the first openings. The first and second openings form an opening with the first opening as its lower portion and the second opening as its upper portion, The method also includes depositing a metal layer in the opening, removing the first and the second photosensitive SLs to laterally expose at least a portion of the metal layer to form a metal feature with a substantially same profile as the opening, forming a barrier layer wrapping over the metal feature and depositing a dielectric layer on sides of the metal feature.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for fabricating a semiconductor integrated circuit (IC), the method comprising:
    providing a substrate;
    forming a patterned sacrifice layer (SL) on the substrate, wherein the patterned SL has an opening therein, wherein the patterned SL includes a patterned first SL with a first opening formed on the substrate and a patterned second SL with a second opening formed on the patterned first SL, wherein the patterned first SL and the patterned second SL are different types of photosensitive material;
    forming a metal layer in the opening;
    removing the patterned SL to laterally expose at least a portion of the metal layer to form a metal feature, wherein a profile of the metal feature is substantially similar to a profile of the opening; and
    depositing a dielectric layer on sides of the metal feature.

2. The method of claim 1, wherein the second opening is configured on the first opening such that a center of the second opening is aligned with a center of the first opening.

3. The method of claim 2, wherein the patterned first SL and the patterned second SL are patterned by lithography processes to form the first opening and the second opening respectively with a first width and a second width, wherein the second width is greater than the first width.

4. The method of claim 3, wherein the metal feature has a lower portion having the first width and an upper portion having the second width.

5. The method of claim 1, further comprising:
    before depositing the dielectric layer, forming a barrier wrapping the metal feature.

6. The method of claim 5, wherein the barrier is self-formed by applying a thermal anneal to the metal feature.

7. The method of claim 5, wherein the barrier is formed by an atomic layer deposition (ALD) process.

8. The method of claim 1, wherein the dielectric layer includes a low-k dielectric material.

9. The method of claim 1, wherein the dielectric layer is formed with air gaps in the dielectric layer.

10. A method for fabricating a semiconductor integrated circuit (IC), the method comprising:
    providing a substrate;
    forming a first sacrifice layer (SL) on the substrate;
    patterning the first SL to have a first opening with a first width;
    forming a second SL on the patterned first SL;
    patterning the second SL to have a second opening with a second width, wherein a center of the second opening is aligned with a center of the first opening, wherein the first and second openings form a combined opening;
    depositing a metal layer in the combined opening;
    removing the first and second SLs to form a metal feature with a profile at least partially defined by the combined opening;
    forming a barrier layer over the metal feature; and
    depositing a dielectric layer on sides of the metal feature.

11. The method of claim 10, wherein the first SL and the second SL include photosensitive material.

12. The method of claim 11, wherein the first SL is a different type of photosensitive material than the second SL.

13. The method of claim 10, wherein the barrier layer is self-formed by applying a thermal anneal to the metal feature.

14. The method of claim 10, wherein the barrier layer is formed by an atomic layer deposition (ALD) process.

15. The method of claim 10, wherein the dielectric layer includes a low-k dielectric material.

16. A method for fabricating a semiconductor integrated circuit (IC), the method comprising:
    providing a substrate;
    forming a first photosensitive sacrifice layer (SL) on the substrate;
    patterning the first photosensitive SL to have a plurality of first openings with a first width;
    forming a second photosensitive SL on the patterned photosensitive first SL;
    patterning the second photosensitive SL to have a plurality of second openings with a second width, wherein the second width is substantially larger than the first width, and further wherein a center of each second opening aligns with a center of a corresponding first opening, each aligned first and second opening forming a combined opening;
    depositing a metal layer in the combined openings;
    removing the first and the second photosensitive SLs to form metal features;
    forming a barrier layer wrapping the metal features; and
    depositing a dielectric layer on sides of the metal features.

17. The method of claim 16, wherein the dielectric layer includes a low-k dielectric material layer.

18. The method of claim 16, wherein one of the first photosensitive SL and the second photosensitive SL includes a negative photosensitive material.

19. The method of claim 1, wherein the patterned first SL includes a positive photosensitive material and the patterned second SL includes a negative photosensitive material.

20. The method of claim 1, wherein the patterned first SL includes a negative photosensitive material and the patterned second SL includes a positive photosensitive material.

* * * * *